(12) United States Patent
Lai

(10) Patent No.: US 7,291,871 B2
(45) Date of Patent: *Nov. 6, 2007

(54) PIXEL STRUCTURE

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 114 days.

This patent is subject to a terminal disclaimer.

(21) Appl. No.: 11/163,438

(22) Filed: Oct. 19, 2005

(65) Prior Publication Data
US 2006/0038175 A1     Feb. 23, 2006

Related U.S. Application Data

(62) Division of application No. 10/604,981, filed on Aug. 29, 2003, now Pat. No. 7,026,648.

(51) Int. Cl.
*H01L 31/0328* (2006.01)

(52) U.S. Cl. .............. 257/184; 257/187; 257/207; 257/291; 257/293

(58) Field of Classification Search .......... 257/184, 257/187, 203, 221, 291, 292, 293, 433, 461, 257/462, 929
See application file for complete search history.

(56) References Cited

U.S. PATENT DOCUMENTS 6,664,568 B2 * 12/2003 Lai ..................... 257/59
7,026,648 B2 *  4/2006 Lai ..................... 257/72

* cited by examiner

*Primary Examiner*—Wai-Sing Louie
(74) *Attorney, Agent, or Firm*—Jianq Chyun IP Office

(57) ABSTRACT

A pixel structure is provided. The pixel structure comprises a scan line, a data line, a pixel electrode and a thin film transistor. The data line branches out into a plurality of subsidiary lines in the area above the scan line. If there is a short circuit between the scan line and the data line, the short circuit can be repaired by cutting the connections to one of the branching subsidiary lines. In one embodiment of this invention, a repair line is set up on one side of the data line such that a portion of the repair line crosses over the scan line. If there is a short circuit between the scan line and the data line, a laser repair operation can be carried out through the repair line.

4 Claims, 9 Drawing Sheets

PIXEL STRUCTURE

CROSS-REFERENCE TO RELATED APPLICATION

This application is a divisional of a prior application Ser. No. 10/604,981, filed Aug. 29, 2003, now U.S. Pat. No. 7,026,648 which claims the priority benefit of Taiwan application serial no. 92107253, filed Mar. 31, 2003. All disclosures are incorporated herewith by reference.

BACKGROUND OF THE INVENTION

1. Field of Invention

The present invention relates to a pixel structure. More particularly, the present invention relates to a pixel structure having a mechanism for repairing possible short-circuits between a scan line and a data line.

2. Description of Related Art

With the rapid advance in semiconductor technologies and man-machine interface designs, multi-media are now at the forefront of communication. In a multi-media world, displays are important devices. Although the cathode ray tube (CRT) is economical to produce and has advantages in many aspects, possible production of hazardous radiation, a bulky body and enormous power consumption are three major factors that diminish its desirableness in a multi-terminal desktop environment. With better resolution, space utilization and power consumption, the thin film transistor liquid crystal display (TFT-LCD) has been developed to serve as a substitute the CRT.

FIG. 1 is a schematic top view of a conventional pixel structure repaired through a laser chemical vapor deposition (CVD). As shown in FIG. 1, a conventional pixel structure 100 comprises a scan line 102, a data line 104, a thin film transistor 106 and a pixel electrode 108. The thin film transistor 106 furthermore comprises a gate 106a, a channel layer 106b and a source/drain 106c. The gate 106 and the scan line 102 are electrically connected together. Similarly, the source/drain 106c, the data line 104 and the pixel electrode 108 are electrically connected together.

The scan line 102 is part of a first metallic layer (metal 1) and the data line 104 is part of a second metallic layer (metal 2). Hence, the scan line 102 and the data line 104 are electrically isolated from each other through a first dielectric layer (a gate insulation layer). In addition, a second dielectric layer (a passivation layer) is also formed over the data line 104. However, a short circuit in the cross over region between the scan line 102 and the data line 104 is possible due to some defects in the dielectric layer, e.g., impurities or particles contamination. Most short-circuits between the scan line 102 and the data line 104 can be repaired. To repair the short circuit, the data line 104 at both ends of a short-circuited region is severed (as shown by the dash line). Thereafter, two repair openings 110 are formed in the second dielectric layer. A laser chemical vapor deposition (CVD) process is performed to form a thin metallic layer 112 linking up the severed data line 104 through the repair openings 110. In other words, the severed data line 104 is reconnected after the reparation.

In a conventional laser repair, the thin metallic line 112 must cross over the scan line 102 to link up both ends of the severed data line 104. Thus, the thin metallic line 112 usually has a considerable length resulting in a longer and costlier repair.

SUMMARY OF THE INVENTION

Accordingly, one object of the present invention is to provide a pixel structure that uses a short laser repair route for repairing any short-circuits between a scan line and a data line.

A second object of this invention is to provide a pixel structure that does not require any laser repair when there is any short-circuit between a scan line and a data line.

To achieve these and other advantages and in accordance with the purpose of the invention, as embodied and broadly described herein, the invention provides a first pixel structure for fabricating on a transparent substrate. The pixel structure comprises a first conductive layer, a first dielectric layer, a channel layer, a second conductive layer, a second dielectric layer and a pixel electrode. The first conductive layer furthermore comprises a scan line and a gate. The gate and the scan line are electrically connected. The first dielectric layer is formed over the transparent substrate covering the first conductive layer. The channel layer is formed over the first dielectric layer above the gate. The second conductive layer is formed over the first dielectric layer. The second conductive layer furthermore comprises a data line and a source/drain. The gate, the channel layer and the source/drain together constitute a thin film transistor. In addition, the data line that corresponds to an area above the scan line branches out into a plurality of subsidiary lines. The second dielectric layer is formed over the first dielectric layer covering the second conductive layer. The pixel electrode is formed over the second dielectric layer. The pixel electrode, the data line and the source/drain are electrically connected together.

In the pixel structure of this invention, the width of the scan line underneath the data line covered area is smaller than the width of the scan line elsewhere.

In the pixel structure of this invention, the second dielectric layer furthermore has a contact opening such that the pixel electrode and the source/drain are electrically connected though a contact inside the contact opening. In addition, the pixel electrode is fabricated using a material including, for example, indium-tin oxide (ITO) or indium-zinc oxide (IZO).

This invention also provides a second pixel structure for fabricating on a transparent substrate. The pixel structure comprises a first conductive layer, a first dielectric layer, a channel layer, a second conductive layer, a second dielectric layer and a pixel electrode. The first conductive layer furthermore comprises a scan line and a gate. The gate and the scan line are electrically connected. The first dielectric layer is formed over the transparent substrate covering the first conductive layer. The channel layer is formed over the first dielectric layer above the gate. The second conductive layer is formed over the first dielectric layer. The second conductive layer furthermore comprises a data line, a repair line and a source/drain. The gate, the channel layer and the source/drain together constitute a thin film transistor. In addition, the repair line is positioned on one side of the data line crossing over the scan line. The second dielectric layer is formed over the first dielectric layer covering the second conductive layer. The pixel electrode is formed over the second dielectric layer. The pixel electrode, the data line and the source/drain are electrically connected together.

In the pixel structure of this invention, one end of the repair line connects electrically with the data line but the other end of the repair line has no connection with the data line. Alternatively, both ends of the repair line have no connection with the data line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
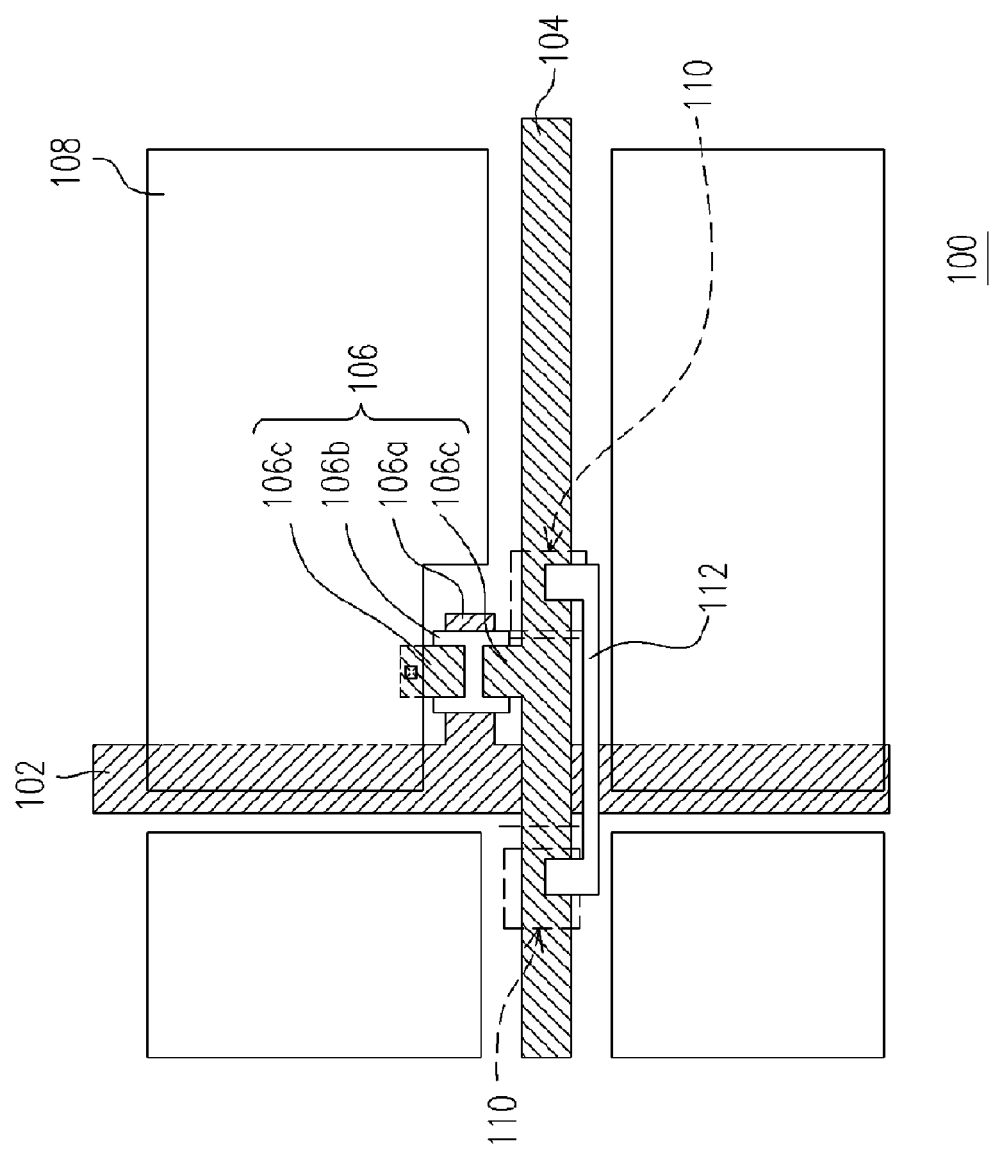
FIG. 1 is a schematic top view of a conventional pixel structure repaired through a laser chemical vapor deposition (CVD).

Reference will now be made in detail to the present preferred embodiments of the invention, examples of which are illustrated in the accompanying drawings. Wherever possible, the same reference numbers are used in the drawings and the description to refer to the same or like parts.

Figure 2A:
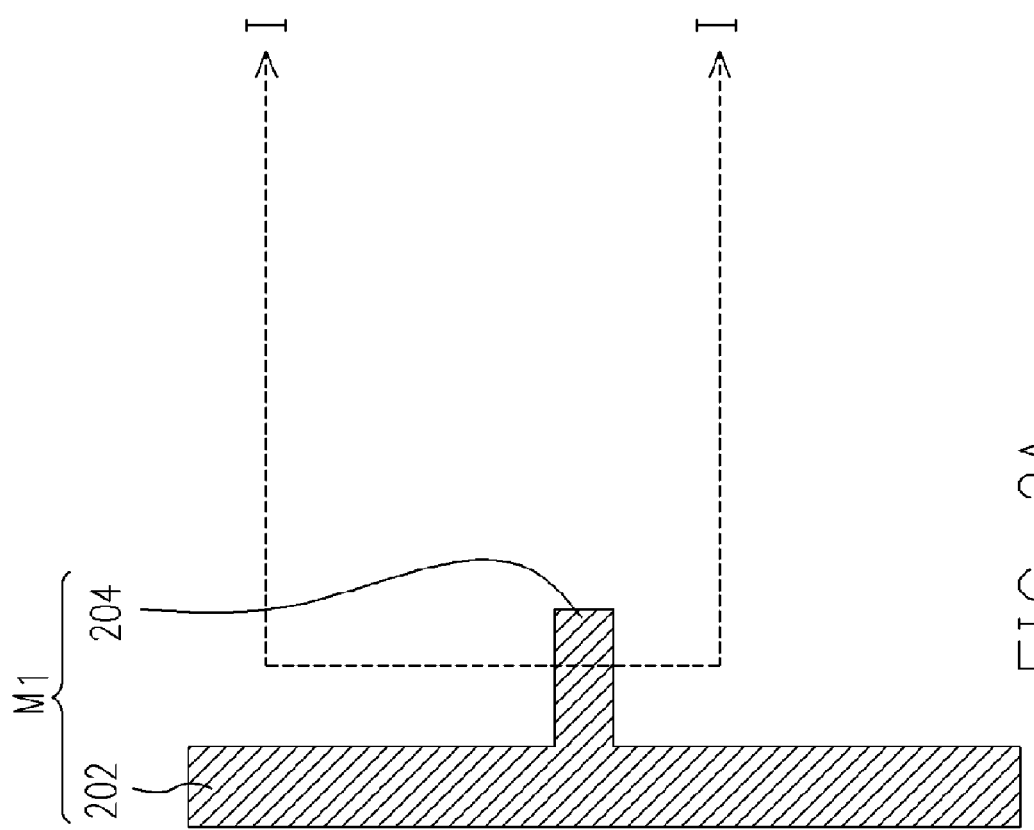
FIGS. 2A to 2D are schematic top views showing the progression of steps for fabricating a pixel structure according to a first preferred embodiment of this invention.

FIGS. 2A to 2D are schematic top views showing the progression of steps for fabricating a pixel structure according to a first preferred embodiment of this invention. FIGS. 3A to 3D are schematic cross-sectional views along line I-I of FIGS. 2A to 2D respectively. As shown in FIGS. 2A and 3A, a transparent substrate 200 such as a glass substrate or a plastic substrate is provided. A first conductive layer (M1) is formed over the transparent substrate 200. The first conductive layer M1 has two sections including a scan line 202 and a gate 204. The gate 204 and the scan line 202 are connected together. Thereafter, a first dielectric layer 206 is formed over the transparent substrate 200 covering the scan line 202 and the gate 204.

Figure 2B:
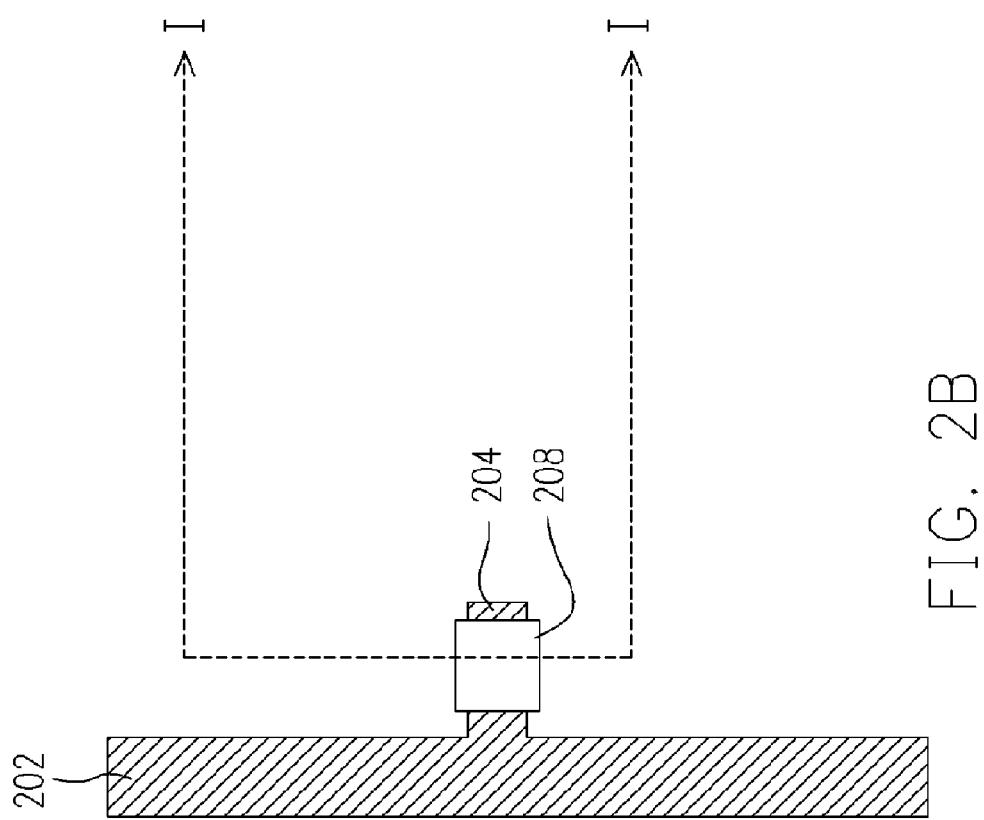
Figure 3A:
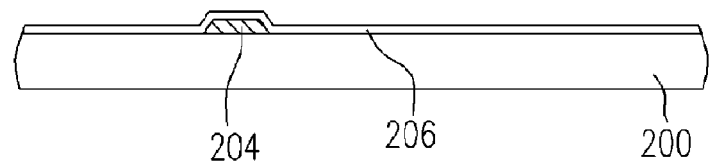
FIGS. 3A to 3D are schematic cross-sectional views along line I-I of FIGS. 2A to 2D respectively.
Figure 3B:
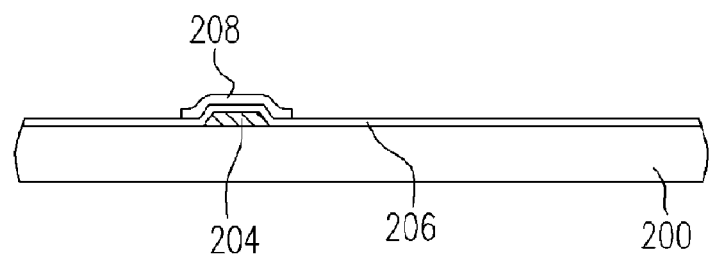

As shown in FIGS. 2B and 3B, a channel layer 208 is formed over the first dielectric layer. The channel layer 208 is positioned over the gate 204.

Figure 2C:
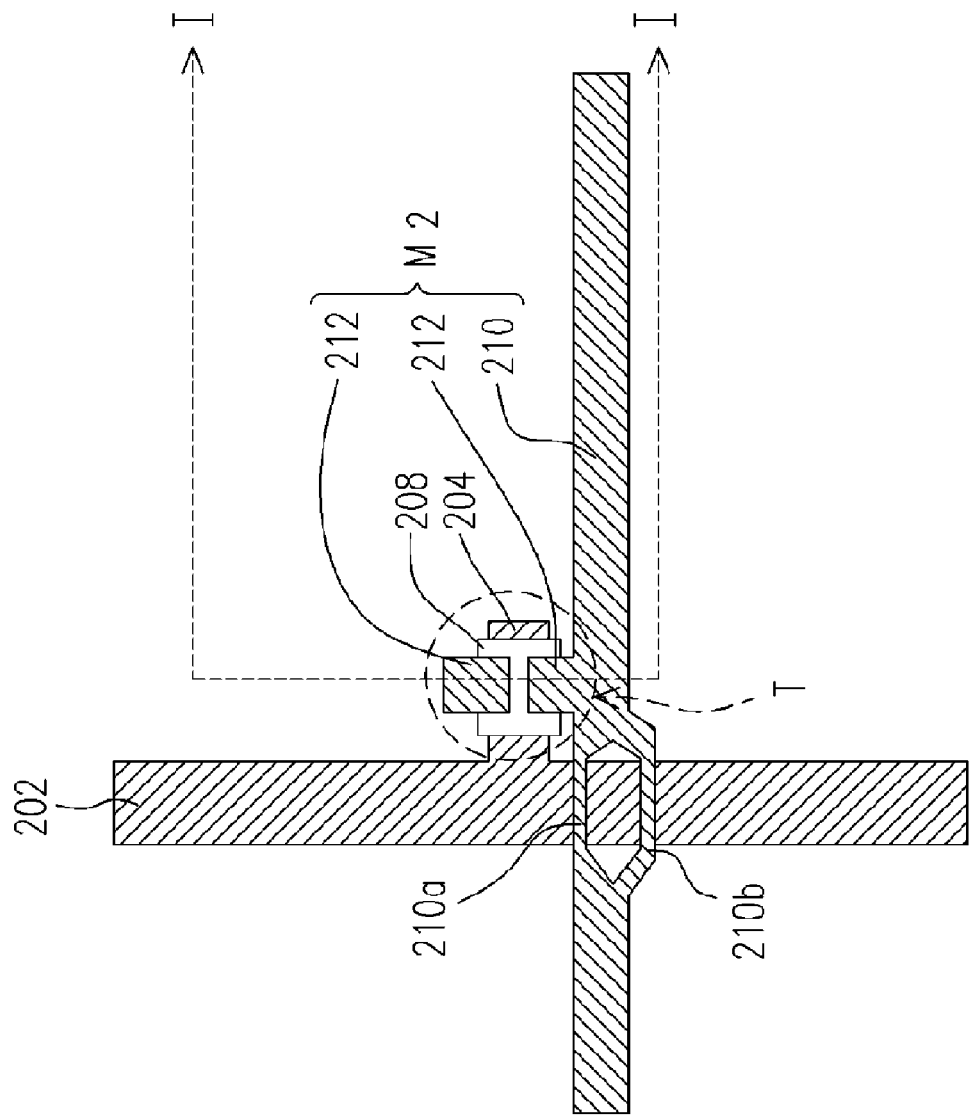
Figure 3C:
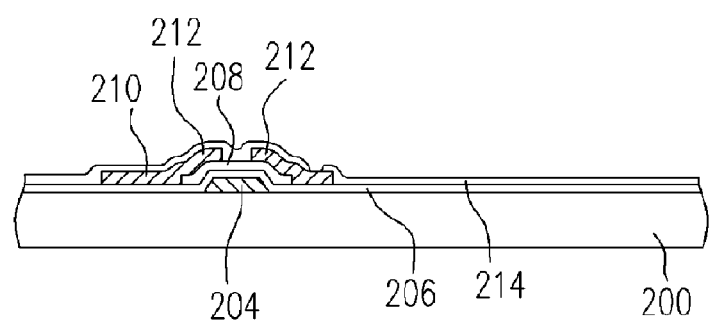

As shown in FIGS. 2C and 3C, a second conductive layer M2 is formed over the channel layer 208. The second conductive layer M2 has two sections including a data line 210 and a pair of source/drain 212. The source/drain 212 are positioned on each side of the channel layer 208 with one of the source/drain 212 electrically connected to the data line 210. In addition, the data line 210 in the area above the scan line 202 branches into a plurality of subsidiary lines 210a and 210b, for example. The stacked structure that includes the gate 204, the channel layer 208, the source/drain 212 together constitute a thin film transistor T. Thereafter, a second dielectric layer 214 is formed over the scan line 202, the data line 210 and the entire thin film transistor T.

Figure 2D:
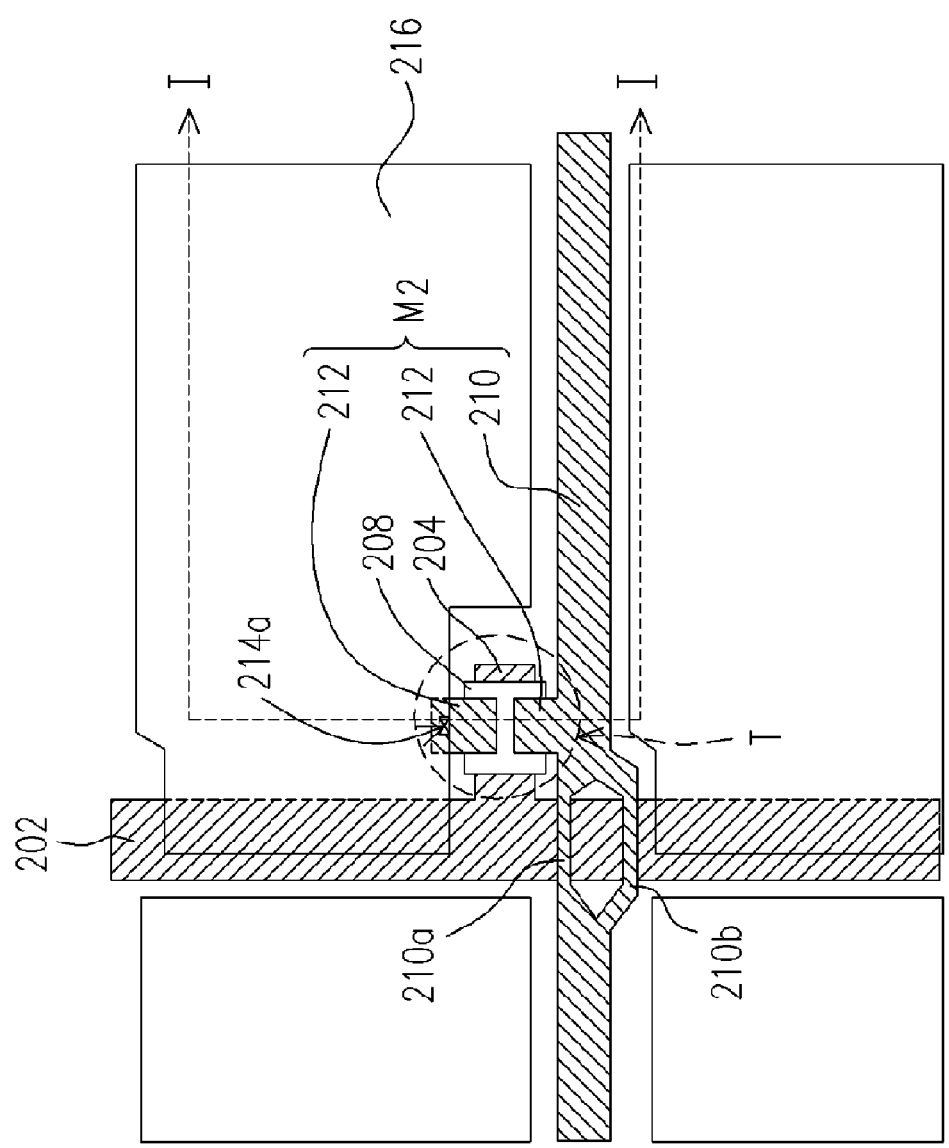
Figure 3D:
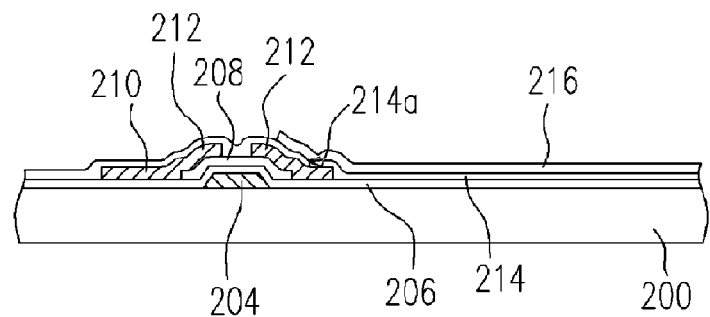

As shown in FIGS. 2D and 3D, a contact opening 214a is formed in the second dielectric layer 214. Thereafter, a pixel electrode 216 is formed over the second dielectric layer 214 so that the pixel electrode 216 and one end of the source/drain 212 are electrically connected through a contact in the contact opening 214a.

In brief, the pixel structure mainly comprises a first conductive layer M1, a first dielectric layer 206, a channel layer 208, a second conductive layer M2, a second dielectric layer 214 and a pixel electrode 216. The first conductive layer M1 furthermore comprises a scan line 202 and a gate 204. The gate 204 and the scan line 202 are electrically connected. The first dielectric layer 206 is positioned over the transparent substrate 200 to cover the first conductive layer M1. The channel layer 208 is positioned over the first dielectric layer 206 above the gate 204. The second conductive layer M2 is positioned over the first dielectric layer 206. The second conductive layer M2 furthermore comprises a data line 210 and a pair of source/drain 212. The data line 210 in the area above the scan line 202 branches into a plurality of subsidiary lines 210a, 210b. Furthermore, the gate 204, the channel layer 208 and the source/drain 212 together constitute a thin film transistor T. The second dielectric layer is positioned over the first dielectric layer 206 to cover the second conductive layer M2. The pixel electrode 216 is positioned over the second dielectric layer 214. The pixel electrode 216, the data line 210 and the source/drain 212 are electrically connected. Moreover, the pixel electrode 216 is fabricated using a material including, for example, indium-tin oxide (ITO) or indium-zinc oxide (IZO).

Figure 4:
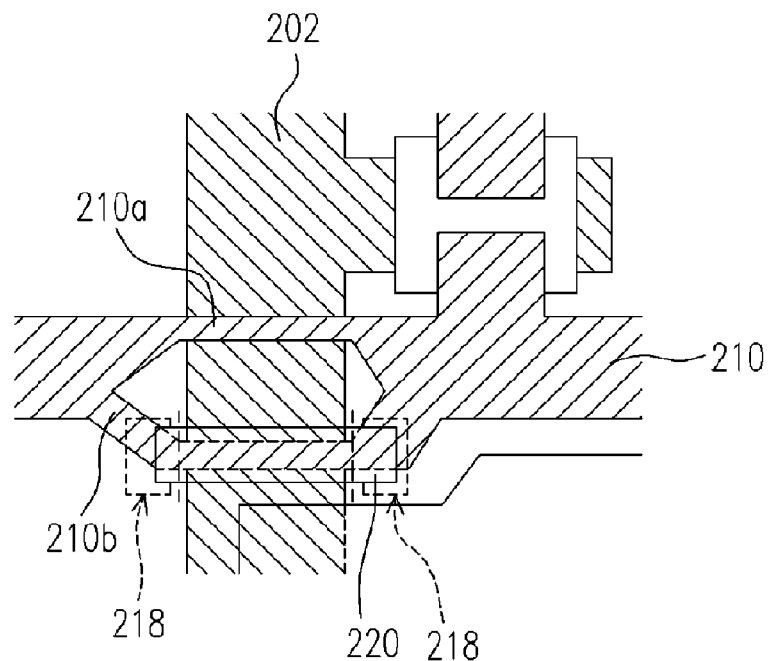
FIGS. 4 and 5 are schematic top views showing two processes for laser-repairing the pixel structure according to the first embodiment of this invention.
Figure 5:
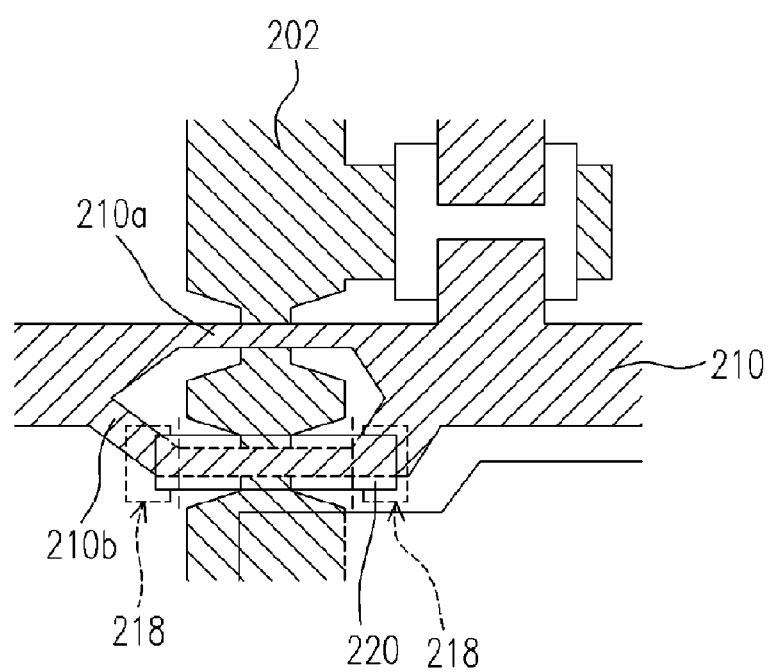

FIGS. 4 and 5 are schematic top views showing two processes for laser-repairing the pixel structure according to the first embodiment of this invention. In FIG. 4, the data line 210 splits up into several subsidiary lines 210a, 210b (two lines in FIG. 4) in the area above the scan line 202. If one of the subsidiary lines 210b happens to have a short circuit with the scan line 202 due to defects caused by impurities or particles contamination, the short-circuited subsidiary line 210b is cut along the dashed line. Thereafter, a pair of repair openings 218 is formed in the second dielectric layer (not shown) and then a thin metallic layer 220 is formed between the repair openings 218 by performing a laser chemical vapor deposition (CVD) process. The thin metallic layer 220 reconnects the severed subsidiary line 210b together through the contact inside the repair openings 218.

However, those skilled in the art may notice that forming a thin metallic layer to reconnect the severed subsidiary data line 210b is redundant because the data line 210 still remains connected through the branch line 210a.

As shown in FIG. 5, the overlapping area with the scan line 202 increases correspondingly when the number of subsidiary lines is increased. To prevent too much parasitic capacitance resulting from an increase in the overlapping of area, the scan line pattern is slightly modified in this embodiment so that the width of the scan line 202 is smaller at the cross over area of the subsidiary lines 210a and 210b.

Figure 6:
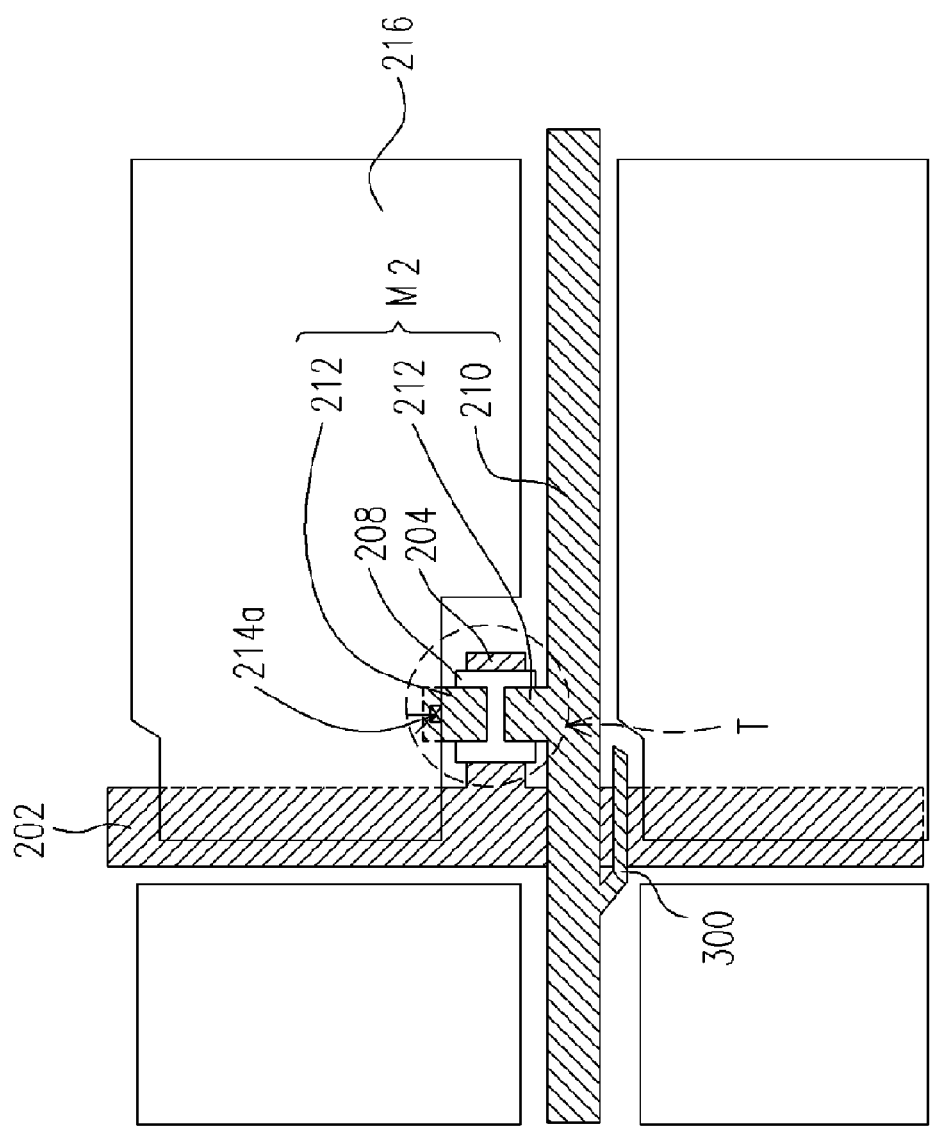
FIG. 6 is a schematic top view showing a pixel structure according to a second preferred embodiment of this invention.

FIG. 6 is a schematic top view showing a pixel structure according to a second preferred embodiment of this invention. The pixel structure in this embodiment is similar to the one in the first embodiment. One major difference between the two is that a repair line 300 is formed on one side of the data line 210. The repair line 300 functions in a way similar to the branching subsidiary lines in the first embodiment of this invention.

Figure 7:
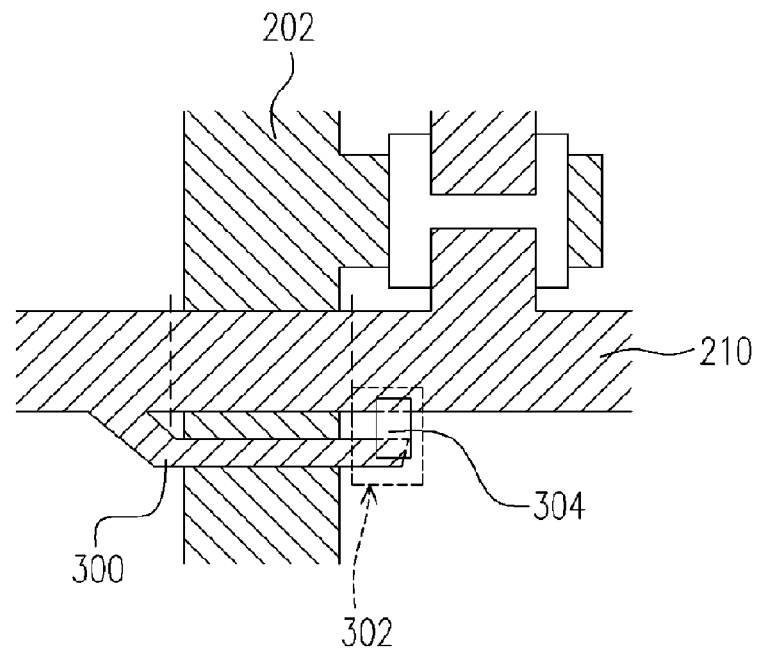
FIGS. 7 and 8 are schematic top views showing two processes for laser-repairing the pixel structure according to the second embodiment of this invention.
Figure 8:
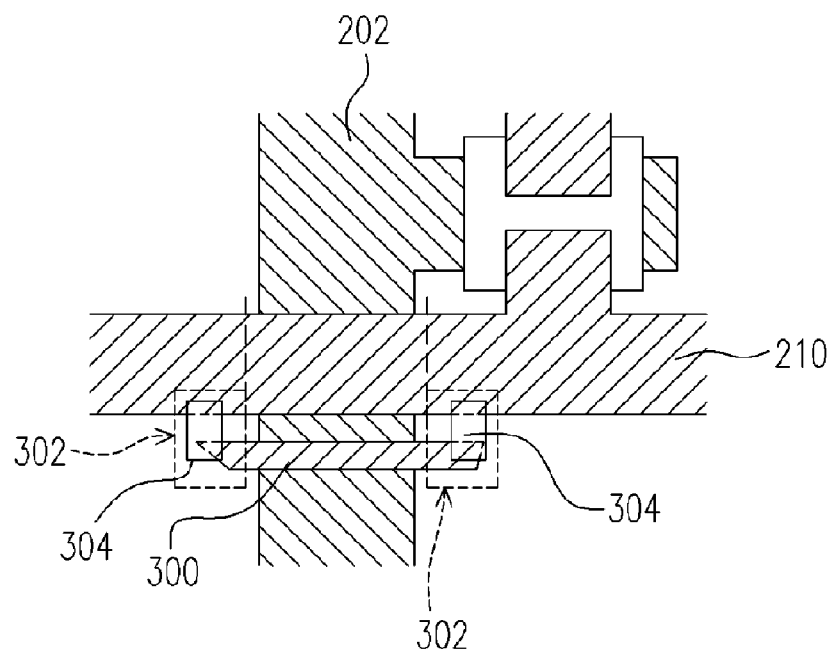

FIGS. 7 and 8 are schematic top views showing two processes for laser-repairing the pixel structure according to the second embodiment of this invention. In FIG. 7, a first end 300a of the repair line 300 connects with the data line 210 but a second end 300b of the repair line 300 has no connection with the data line 210. If there is a short circuit between the scan line 202 and the data line 210, the section of the data line 210 having the short-circuiting is severed along the dashed lines. Thereafter, a repair opening 302 is formed at the second end 300b of the repair line. A thin metallic layer 304 is formed between the second end 300b of the repair line 300 and the data line 210 by performing a laser chemical vapor deposition (CVD) process. In other words, the thin metallic layer 304 reconnects the severed data line 210 through the repair line 300 and the thin metallic layer 304.

In FIG. 8, however, neither end of the repair line 300 has a direct connection with the data line 210. If there is a short circuit between the scan line 202 and the data line 210, the section of the data line 210 having the short-circuiting is severed along the dashed lines. Thereafter, a repair opening 302 is formed at the first end 300a and the second end 300b of the repair line 300. Finally, a thin metallic layer 304 is formed between each of the repair openings 302 and corresponding severed ends of the data line 210.

In summary, the pixel structure of this invention has at least the following advantages.

1. Due to the provision of a plurality of branching subsidiary data lines in the area above the scan line, a short circuit in one of the branching data lines can be repaired by severing the short-circuiting section of that particular branch without performing a laser repair.

2. Since a short thin metallic layer for connecting one end or both ends of a repair line to a severed data line needs to be formed in a laser repair operation, the reparation can be carried out cheaper and faster.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure comprising a scan line, a data line, a pixel electrode and a thin film transistor, wherein the thin film transistor comprises a gate, a channel layer and a source/drain such that the gate and the scan line are electrically connected and the source/drain, the data line and the pixel electrode are electrically connected, and one major characteristic of the pixel structure is that the data line in area above the scan line branches out into a plurality of subsidiary lines, and the width of the scan line in the area underneath the data line is smaller than the width of the scan line in other areas.

2. A pixel structure comprising a scan line, a data line, a pixel electrode and a thin film transistor, wherein the thin film transistor comprises a gate, a channel layer and a source/drain such that the gate and the scan line are electrically connected and the source/drain, the data line and the pixel electrode are electrically connected, and one major characteristic of the pixel structure is that a repair line is set up on one side of the data line with a portion of the repair line crossing over the scan line.

3. The pixel structure of claim 2, wherein the repair line furthermore comprises a first end and a second end such that the first end of the repair line connects with the data line but the second end of the repair line has no electrical connection with the data line.

4. The pixel structure of claim 2, wherein the repair line furthermore comprises a first end and a second end such that both the first end and the second end have no electrical connection with the data line.

* * * * *